US012668726B2

(12) United States Patent
Kim

(10) Patent No.: US 12,668,726 B2
(45) Date of Patent: Jun. 30, 2026

(54) ADHESIVE COMPOSITION AND METHOD OF MANUFACTURING A SEMICONDUCTOR DEVICE USING THE SAME

(71) Applicant: SAMSUNG ELECTRONICS CO., LTD., Suwon-si (KR)

(72) Inventor: Hyungjun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 93 days.

(21) Appl. No.: 18/597,179

(22) Filed: Mar. 6, 2024

(65) Prior Publication Data

US 2025/0075111 A1 Mar. 6, 2025

(30) Foreign Application Priority Data

Sep. 1, 2023 (KR) ........................ 10-2023-0116126

(51) Int. Cl.
*C09J 133/08* (2006.01)
*H10P 72/70* (2026.01)

(52) U.S. Cl.
CPC ........ *C09J 133/08* (2013.01); *H10P 72/7402* (2026.01); *H10P 72/7416* (2026.01); *H10P 72/7442* (2026.01)

(58) Field of Classification Search
CPC ... C09J 133/08; C09J 7/30; C09J 11/06; C09J 143/04; C09J 2203/326; C09J 2301/312; C09J 2301/416; C09J 2301/502; H01L 21/6836; H01L 2221/68327; H01L 2221/68386; C08F 283/12; C08L 33/04
See application file for complete search history.

(56) References Cited

U.S. PATENT DOCUMENTS

| | | | |
|---|---|---|---|
| 10,729,806 B2 | 8/2020 | Bingol et al. | |
| 2021/0155831 A1* | 5/2021 | Jang .................. | C09D 133/066 |

FOREIGN PATENT DOCUMENTS

| | | | | |
|---|---|---|---|---|
| JP | 2582875 | B2 | | 5/1990 |
| JP | 2019052265 | A | * | 4/2019 |
| JP | 6520323 | B2 | | 5/2019 |
| KR | 10-0491631 | B1 | | 5/2005 |
| KR | 10-1170529 | B1 | | 8/2012 |
| KR | 10-1318198 | B1 | | 10/2013 |
| KR | 10-2286594 | B1 | | 8/2021 |
| KR | 10-2021-0135473 | A | | 11/2021 |

OTHER PUBLICATIONS

Park, et al., "Adhesion improvement of the acrylic pressure-sensitive adhesive to low-surface-energy substrates using silicone urethane dimethacrylates", European Polymer Journal 137 (2020) 10994, pp. 1-8.

* cited by examiner

*Primary Examiner* — Christopher W Raimund
(74) *Attorney, Agent, or Firm* — Morgan, Lewis & Bockius LLP

(57) ABSTRACT

An adhesive composition comprising a binder resin and a photoinitiator. The binder resin includes a linear or a partially crosslinked copolymer having a plurality of repeating units derived from different acrylate monomers. The copolymer includes a repeating unit having a photoreactive functional group at a side chain and a repeating unit having a siloxane-based functional group at a side chain. The repeating unit has a siloxane-based functional group in a range of about 2% to about 5% of a total weight of the copolymer.

20 Claims, 2 Drawing Sheets

ADHESIVE COMPOSITION AND METHOD OF MANUFACTURING A SEMICONDUCTOR DEVICE USING THE SAME

CROSS-REFERENCE TO RELATED APPLICATION

This application claims priority under 35 U.S.C. § 119 to Korean Patent Application No. 10-2023-0116126, filed on Sep. 1, 2023 in the Korean Intellectual Property Office, the disclosure of which is incorporated by reference in its entirety herein.

TECHNICAL FIELD

Example embodiments relate to an adhesive composition and method of manufacturing a semiconductor device using the same.

DISCUSSION OF RELATED ART

In a method of manufacturing a semiconductor device, a wafer including a plurality of semiconductor chips may be temporarily fixed on a base film by using an adhesive sheet including an adhesive composition. A sawing process may then be performed on the wafer to separate the semiconductor chips from each other. The semiconductor chips may then be removed from the adhesive sheet. The adhesive sheet should have a high level of adhesion during the sawing process and subsequent processes. The adhesive sheet should also have a high level of peelability to avoid damaging the semiconductor chips in the process of removing the semiconductor chips from the adhesive sheet and to prevent a residue from remaining on a surface of the base film. Recently, a photocurable adhesive composition having reduced adhesive strength by ultraviolet irradiation has been used. However, the size of the semiconductor chip has become increasingly smaller, and the need to selectively adjust adhesion before and after ultraviolet irradiation has been increasing.

SUMMARY

Example embodiments provide an adhesive composition having increased characteristics.

Example embodiments provide a method of manufacturing a semiconductor device using an adhesive composition having increased characteristics.

According to an embodiment of the present disclosure, an adhesive composition includes a binder resin and a photoinitiator. The binder resin includes a linear or a partially crosslinked copolymer having a plurality of repeating units derived from different acrylate monomers. The copolymer includes a repeating unit having a photoreactive functional group at a side chain and a repeating unit having a siloxane-based functional group at a side chain. The repeating unit having a siloxane-based functional group is in a range of about 2% to about 5% of a total weight of the copolymer.

According to an embodiment of the present disclosure, an adhesive composition includes a binder resin including a linear or partially crosslinked copolymer. The copolymer has a plurality of repeating units derived from different acrylate monomers and at least one repeating unit derived from an acrylic acid monomer. The copolymer includes a repeating unit having a photoreactive functional group at a side chain and a repeating unit having a siloxane-based functional group at a side chain. The repeating unit having the siloxane-based functional group is in a range of about 2% to about 5% of a total weight of the copolymer.

According to an embodiment of the present disclosure, a method of manufacturing a semiconductor device includes attaching a wafer including a plurality of semiconductor chips on an adhesive layer including a binder resin and a photoinitiator. The wafer is sawed to separate the semiconductor chips from each other. The semiconductor chips are peeled from the adhesive layer after irradiating the adhesive layer with ultraviolet ray. The binder resin includes a linear or a partially crosslinked copolymer having a plurality of repeating units derived from different acrylate monomers. The copolymer includes a repeating unit having a photoreactive functional group at a side chain and a repeating unit having a siloxane-based functional group at a side chain. The repeating unit having a siloxane-based functional group is in a range of about 1% to about 5% of a total weight of the copolymer.

In an adhesive composition according to an embodiment of the present disclosure and a method of manufacturing a semiconductor device using the same, adhesion before and after UV curing may be selectively adjusted.

DETAILED DESCRIPTION OF EMBODIMENTS

Figure 1:
FIGS. 1 to 4 are cross-sectional views illustrating a method of manufacturing a semiconductor device using an adhesive sheet for temporary fixation according to example embodiments.

The above and other aspects and features of the semiconductor devices and the methods of manufacturing the same in accordance with example embodiments will become readily understood from detail descriptions that follow, with reference to the accompanying drawings. It will be understood that, although the terms “first,” “second,” and/or “third” may be used herein to describe various materials, layers, regions, pads, electrodes, patterns, structure and/or processes, these various materials, layers, regions, pads, electrodes, patterns, structure and/or processes should not be limited by these terms. These terms are only used to distinguish one material, layer, region, pad, electrode, pattern, structure or process from another material, layer, region, pad, electrode, pattern, structure or process. Thus, “first”, “second” and/or “third” may be used selectively or interchangeably for each material, layer, region, electrode, pad, pattern, structure or process respectively.

I. Adhesive Composition

In an embodiment, the adhesive composition may include (i) a binder resin including an acrylate-based resin having a siloxane-based functional group and a photoreactive functional group derived from a photocurable compound E and (ii) a photoinitiator G. Each component is described in detail below.

(i) The Binder Resin

In an embodiment, the binder resin may include a linear or a partially crosslinked copolymer having a plurality of repeating units derived from different acrylate monomers. The binder resin may include the acrylate-based resin having the siloxane-based functional group and the photoreactive functional group. In an embodiment, the acrylate-based resin including the siloxane-based functional group and the photoreactive functional group may have 1) a first repeating unit derived from an acrylate monomer A, 2) a second repeating unit derived from an acrylate monomer containing a reactive functional group such as a hydroxy group B, 3) a third repeating unit C derived from acrylic acid, and 4) a fourth repeating unit D derived from an acrylate monomer containing a siloxane-based functional group.

In an embodiment, about 65 to about 95 mol % of the second repeating units B, for example about 70 to about 90 mol % of the second repeating units B may react with a photocurable compound E, which is a multifunctional crosslinking agent having a photoreactive functional group, to include the photoreactive functional group (hereinafter referred to as a second-1 repeating unit B-1). Remaining ones of the second repeating units B may react with a thermosetting crosslinking agent F to form a three-dimensional cross-linked structure (hereinafter referred to as a second-2 repeating unit B-2).

1) The First Repeating Unit

In an embodiment, the first repeating unit A may derive from an acrylate monomer or a (meth)acrylate monomer that may not contain reactive functional groups such as siloxane-based functional groups and hydroxy groups. An acrylate monomer may be a material including a (meth)acrylate monomer. For example, in an embodiment the first repeating unit may derive from an aliphatic acrylate monomer, an aliphatic (meth)acrylate monomer, an alicyclic acrylate monomer, an alicyclic (meth)acrylate monomer, an aromatic acrylate monomer, an aromatic (meth)acrylic, etc.

In an embodiment, the aliphatic acrylate monomer may include an alkyl acrylate having an alkyl group with 1 to 20 carbon atoms, for example, methyl acrylate, ethyl acrylate, n-propyl acrylate, isopropyl acrylate, n-butyl acrylate, t-butyl acrylate, sec-butyl acrylate, pentyl (meth)acrylate, 2-ethylhexyl acrylate, 2-ethylbutyl acrylate, n-octyl acrylate, iso-octyl acrylate, isononyl acrylate, etc.

In an embodiment, the aliphatic (meth)acrylate monomer may include an alkyl (meth)acrylate having an alkyl group with 1 to 20 carbon atoms, for example, methyl (meth) acrylate, ethyl (meth)acrylate, n-propyl (meth)acrylate, isopropyl (meth)acrylate, n-butyl (meth)acrylate, t-butyl (meth) acrylate, sec-butyl (meth)acrylate, pentyl (meth)acrylate, 2-ethylhexyl (meth)acrylate, 2-ethylbutyl (meth)acrylate, n-octyl (meth)acrylate, iso-octyl (meth)acrylate, isononyl (meth)acrylate, etc.

In an embodiment, the cycloaliphatic acrylate monomer may include a cycloalkyl acrylate having a cycloalkyl group with 3 to 30 carbon atoms, for example, isobornyl acrylate (IBOA), trimethylcyclohexyl acrylate, cyclopentyl acrylate, cyclohexyl acrylate, dicyclofentanyl acrylate, dicyclopentenyloxy acrylate, etc.

In an embodiment, the cycloaliphatic (meth)acrylate monomer may include a cycloalkyl (meth)acrylate having a cycloalkyl group with 3 to 30 carbon atoms, for example, isobornyl methacrylate (IBOA), trimethylcyclohexyl (meth) acrylate, cyclofencyl (meth)acrylate, cyclohexyl (meth) acrylate, dicyclofentanyl methacrylate, dicyclopentenyloxy methacrylate, etc.

In an embodiment, the aromatic acrylate monomer may include an alkyl acrylate having an aromatic group with 6 to 30 carbon atoms, for example, phenylpropyl acrylate, o-phenylphenol EO acrylate, 3-phenylphenoxypropyl acrylate, phenol EO acrylate, etc.

In an embodiment, the aromatic (meth)acrylate monomer may include an alkyl (meth)acrylate having an aromatic group with 6 to 30 carbon atoms, for example, phenylpropyl (meth)acrylate, o-phenylphenol EO acrylate, 3-phenylphenoxypropyl (meth)acrylate, phenol EO (meth)acrylate, etc.

In an embodiment, the acrylate monomer or the (meth) acrylate monomer may have an alkyl group with 1 to 12 carbon atoms, for example, an alkyl group with 1 to 8 carbon atoms. Adhesion of the adhesive composition may be easily controlled by the alkyl group of the acrylate monomer or the (meth)acrylate monomer within the above range.

In an embodiment, the first repeating unit A may be in a range of about 70% to about 90% of a total weight of the binder resin. For example, the first repeating unit A may be in a range of about 75% to about 80% of the total weight of the binder resin. The durability and reliability of the adhesive composition may be reduced if the first repeating unit A is less than about 70% of the total weight of the binder resin, and adhesiveness and peelability may be reduced if the first repeating unit A exceeds about 90% of the total weight of the binder resin. Content of each repeating unit in the binder resin may be obtained by nuclear magnetic resonance (NMR) analysis.

2) The Second Repeating Unit

In an embodiment, the second repeating unit B may derive from an acrylate monomer containing a reactive functional group such as a hydroxy group. Some of the reactive functional groups of the second repeating unit B may react with the photocurable compound E, which may be a multifunctional crosslinking agent, to form photoreactive functional groups at a side chain. Remaining ones of the reactive functional groups may react with the thermosetting crosslinking agent F to form a three-dimensional cross-linked structure during a subsequent heat curing process. Accordingly, the binder resin can selectively control adhesive strength.

In an embodiment, the second repeating unit B may derive from an acrylate monomer containing a hydroxy group or a (meth)acrylate monomer containing a hydroxy group. An acrylate monomer may be a material including a (meth) acrylate monomer.

In an embodiment, the acrylate monomer containing a hydroxy group may include, for example, 2-hydroxyethyl acrylate, 2-hydroxypropyl acrylate, 4-hydroxybutyl acrylate, 6-hydroxyhexyl acrylate, 8-hydroxyoctyl acrylate, 2-hydroxyethylene glycol acrylate, 2-hydroxypropylene glycol acrylate, etc.

In an embodiment, the (meth)acrylate monomers containing a hydroxy group may include, for example, 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 2-hydroxyethylene glycol (meth)acrylate, 2-hydroxypropylene glycol (meth)acrylate, etc.

The acrylate monomer containing a hydroxy group and the (meth)acrylate monomer containing a hydroxy group may be used alone or in a mixture of two or more types.

In an embodiment, the second repeating unit B may be, for example, in a range of about 10% to about 25% of the total weight of the binder resin. For example, the second repeating unit B may be in a range of about 10% to about 20% of the total weight of the binder resin. The durability and reliability of the adhesive composition may be reduced if the second repeating unit B is less than about 10% of the total weight of the binder resin, and the adhesive strength and peelability may be reduced if the second repeating unit B exceeds about 25% of the total weight of the binder resin. In an embodiment, the first repeating unit A and the second repeating unit B may be in a range of about 90% to about 95% of the total weight of the binder resin.

In an embodiment, the second repeating unit B may include 1) the second-1 repeating unit B-1 in which the hydroxyl group may react with the photocurable compound E, which is a multifunctional crosslinking agent, to contain the photoreactive functional group in the side chain, and 2) the second-2 repeating unit B-2 in which the hydroxy group may react with the thermosetting crosslinking agent F to form a three-dimensional crosslinking structure.

In an embodiment, about 70 to 90 mol % of the second repeating units B may be the second-2 repeating unit B-2 having the photoreactive functional group, and all or a portion of the remaining ones of the second repeating units B may form the three-dimensional cross-linked structure.

In an embodiment, the photoreactive functional group of the second repeating unit B may react to the photoinitiator G when irradiated with ultraviolet rays to form a three-dimensional crosslinked structure. Thus, cohesion within the adhesive composition may increase, which may significantly reduce the adhesive strength of the adhesive composition. Accordingly, the semiconductor chip may be easily peeled off without any residue of the adhesive composition. In an embodiment, the photoreactive functional group may be a functional group containing a carbon-carbon double bond, for example, a vinyl group, an allyl group, a (meth)acryloyl group, etc.

3) The Third Repeating Unit

In an embodiment, the third repeating unit C may derive from an acrylic acid monomer or a (meth)acrylic acid monomer. For example, an acrylic acid monomer may be a material including a (meth)acrylic acid monomer. The third repeating unit C may have a higher surface tension than that of the first, second, and fourth repeating units A, B and D, and thus, may serve to increase adhesion before ultraviolet curing.

In an embodiment, the third repeating unit C may be in a range of about 1% to about 5% of the total weight of the binder resin. For example, the third repeating unit C may be in a range of about 1% to about 3% of the total weight of the binder resin. In an embodiment, a combined weight of the first repeating unit, the second repeating unit and the third repeating unit are in a range of about 90% to about 99% of a total weight of the binder resin. The adhesive strength of the adhesive composition before irradiation with ultraviolet rays may not be sufficiently high if the third repeating unit C is less than about 1% of the total weight of the binder resin, and adhesive strength of the adhesive composition may be too strong even after irradiation with ultraviolet rays, causing peelability to deteriorate if the third repeating unit C exceeds about 5% of the total weight of the binder resin.

4) The Fourth Repeating Unit

In an embodiment, the fourth repeating unit D may derive from an acrylate monomer containing a siloxane-based functional group at a side chain.

In an embodiment, the siloxane-based functional group may include a polyalkylsiloxane group in which 1 to 200 alkylsiloxanes are bonded, a polyarylsiloxane group in which 1 to 200 arylsiloxanes are bonded, a polyorganosiloxane group in which 2 to 200 alkylsiloxanes and arylsiloxanes are bonded, etc. In an embodiment, alkyl may include an alkyl group with 1 to 20 carbon atoms, for example, methyl, ethyl, propyl, etc., and aryl may include an aryl group with 6 to 20 carbon atoms, for example, phenyl. In an embodiment, the siloxane-based functional group may be any one of the functional groups represented by following Formulas 1a to 1c.

[Formula 1a]

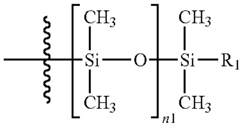

-continued

[Formula 1b]

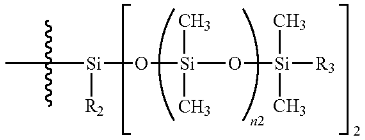

[Formula 1c]

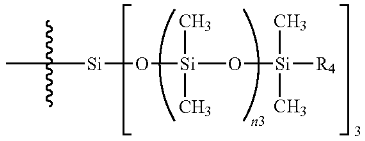

In the above Formulas 1a to 1c, each of R1 to R4 may be a hydrogen atom or an alkyl group having 1 to 10 carbon atoms. For example, each of R1 to R4 may be a hydrogen atom or an alkyl group having 1 to 4 carbon atoms, and even more specifically, a hydrogen atom or a methyl group. In addition, each of n1 to n3 may be an integer from 1 to 200. For example, each of n1 to n3 may be an integer from 5 to 100.

In an embodiment, the fourth repeating unit D may derive from an acrylate monomer containing a siloxane-based functional group represented by the following Formulas 2a to 2c.

[Formula 2a]

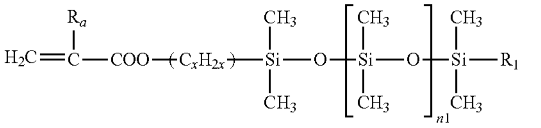

[Formula 2b]

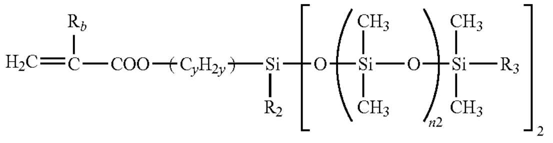

[Formula 2c]

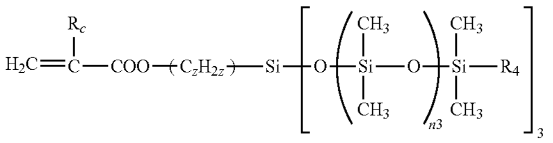

In the above Formulas 2a to 2c, each of R1 to R4 may be a hydrogen atom or an alkyl group having 1 to 10 carbon atoms. For example, each of R1 to R4 may be a hydrogen atom or an alkyl group having 1 to 4 carbon atom. Each of Ra to Re may be a hydrogen or methyl group. Each of x, y and z may be an integer of 1 to 3. Each of n1 to n3 may be an integer of 1 to 200. For example, each of n1 to n3 may be an integer of 5 to 100.

In an embodiment, the acrylate monomer containing the siloxane-based functional group from which the fourth repeating unit D is derived may have a weight average molecular weight (Mw) in a range of about 5000 g/mol to about 10,000 g/mol. In the above weight average molecular weight range, the adhesive strength before and after ultraviolet curing may be selectively adjusted.

The acrylate monomer containing the siloxane-based functional group, from which the fourth repeating unit D is derived, may contain an acrylate group at one end. In an embodiment, the fourth repeating unit D may form a random copolymer by an addition reaction with the monomers from which each of the first to third repeating units A, B and C are derived.

In an embodiment, the fourth repeating unit D may be in a range of about 2 to about 10% of the total weight of the binder resin. For example, the fourth repeating unit D may be in a range of about 3% to about 5% of the total weight of the binder resin. The durability and reliability of the adhesive composition may be reduced if the fourth repeating unit D is less than about 2% of the total weight of the binder resin, and the adhesive strength and peelability may be reduced if the fourth repeating unit D exceeds about 10% of the total weight of the binder resin.

In an embodiment, the first repeating unit A of the binder resin may derive from n-butyl acrylate monomer, 2-ethylhexyl acrylate monomer, or a combination thereof, the second repeating unit B may derive from 2-hydroxylethyl acrylate monomer, and the fourth repeating unit D may derive from [Formula 2a] in which Ra is a hydrogen atom, x is 3, and n1 ranges from 50 to 150, for example 60 to 130. In an embodiment, a weight ratio of the first repeating unit A to the second repeating unit B to the third repeating unit C and to the fourth repeating unit D may be 78:15:2:5.

5) Method of Manufacturing the Binder Resin

In an embodiment, the binder resin may be formed by (a. Process) a polymerization reaction of a mixture of monomers from which each of the first to fourth repeating units A, B, C and D is derived, (b. Process, formation of the second-1 repeating unit B-1) introducing a photoreactive functional group into the second repeating unit B by reacting some of the hydroxy groups of the second repeating units B with the photocurable compound E, (c. Process, formation of the second-2 repeating unit B-2) reacting remaining ones of the hydroxyl groups of the second repeating units B with the thermosetting crosslinking agent F to form a three-dimensional crosslinked structure.

a. Process

In an embodiment, the polymerization reaction to form the binder resin may be performed by solution polymerization, photo polymerization, bulk polymerization, suspension polymerization, emulsion polymerization, etc. The solution polymerization may be relatively easy to perform and may produce polymer with excellent uniformity. Thus, the solution polymerization may be utilized to produce the binder resin.

In an embodiment, an alkyl acrylate monomer from which the first repeating unit A is derived, an acrylate monomer containing a hydroxy group from which the second repeating unit B is derived, an acrylic acid monomer from which third repeating unit C is derived, an acrylate monomer containing a siloxane-based functional group from which the fourth repeating unit D is derived and a thermal initiator may be mixed, and a copolymerization reaction may be performed in a range of about 50° C. to about 140° C. Accordingly, a preliminary binder resin containing the first to fourth repeating units A, B, C and D may be formed.

In an embodiment, the thermal initiator may be, for example, an azo-based initiator such as azobisisobutyronitrile, azobiscyclohexane carbonitrile, etc., a peroxide-based initiator such as benzoyl peroxide, acetyl peroxide, etc., or a mixture of an azo-based initiator and the peroxide-based initiator.

b. Process, Formation of the Second-1 Repeating Unit B-1

In an embodiment, the photocurable compound E having a photoreactive functional group and a functional group that is capable of condensation reaction with the reactive functional group of the second repeating unit B, may be added to the preliminary binder resin, and the preliminary binder resin and the photocurable compound E may be subjected to a condensation reaction. Accordingly, the photoreactive functional group may be introduced into some of the second repeating units B of the preliminary binder resin. The second repeating units B containing the photoreactive functional group may also be referred to as the second-1 repeating units B-1.

In an embodiment, the reactive functional group, such as a functional group capable of condensation reaction with a hydroxy group, may include an isocyanate group, and may be appropriately selected depending on the type of functional group included in the second repeating unit B. Accordingly, in an embodiment the photocurable compound (E) may be, for example, (meth)acryloyloxy isocyanate, (meth)acryloyloxy methyl isocyanate, 2-(meth)acryloyloxy ethyl isocyanate, 3-(meth) Acryloyloxy propyl isocyanate, 4-(meth)acryloyloxy butyl isocyanate, m-propenyl-α,α dimethylbenzyl isocyanate, methacryloyl isocyanate, allyl isocyanate, (meth)acryloyl diisocyanate obtained by reacting a diisocyanate compound with (meth)acrylic acid 2-hydroxyethyl, and (meth)acryloyl polyisocyanate compound obtained by reacting a polyisocyanate compound with 2-hydroxyethyl (meth)acrylate.

In an embodiment, the photoreactive functional group of the photocurable compound E may be introduced into about 70 mol % to about 90 mol % of the second repeating unit B. The second repeating unit B into which the photoreactive functional group is introduced may be referred to as the second-1 repeating unit B-1. The decrease of the adhesive strength by ultraviolet irradiation may not be sufficient if the second-1 repeating unit B-1, into which the photoreactive functional group is introduced, is less than about 70 mol % of the second repeating unit B, and cohesion of the adhesive composition before ultraviolet irradiation may decrease if the second-1 repeating unit B-1 exceeds about 90 mol % of the second repeating unit B.

c. Process, Formation of the Second-2 Repeating Unit B-2

In an embodiment, the thermosetting crosslinking agent F and a heat initiator may be added to the preliminary binder resin, and remaining ones of the second repeating units B may react with the thermosetting crosslinking agent F to form a three-dimensional crosslinking structure. The remaining ones of the second repeating units B forming the three-dimensional cross-linked structure may be referred to as the second-2 repeating units B-2.

The thermosetting crosslinking agent F may increase the adhesive strength of the adhesive composition by reacting with the reactive functional group (for example, a hydroxy group) of the binder resin.

In an embodiment, the thermosetting crosslinking agent F may be one or more compounds selected from a group consisting of isocyanate-based compounds, aziridine-based compounds, epoxy-based compounds and metal chelate-based compounds. Isocyanate-based compounds, aziridine-based compounds, epoxy-based compounds and metals chelate-based compounds may be used without particular restrictions as long as they are compounds commonly used in the art.

In an embodiment, isocyanate-based compounds may include, for example, tolylene diisocyanate, xylene diisocyanate, diphenylmethane diisocyanate, hexamethylene diisocyanate, isoborone diisocyanate, tetramethylxylene diisocyanate, naphthalene diisocyanate, and any one or more selected from a group consisting of reactants of the above isocyanate-based compounds with polyol (ex., trimethylol propane).

In an embodiment, aziridine-based compounds may include, for example, N,N'-toluene-2,4-bis(1-aziridinecarboxamide), N,N'-diphenylmethane-4,4'-bis(1-aziridine carboxamide), triethylene melamine, bisisoprotaloyl-1-(2-methylaziridine) and tri-1-aziridinylphosphine oxide.

In an embodiment, epoxy compounds may include, for example, ethylene glycol diglycidyl ether, triglycidyl ether, trimethylolpropane triglycidyl ether, N,N,N,N-tetraglycidyl ethylenediamine, and glycerin diglycidyl.

In an embodiment, a metal chelate-based compound may include, for example, compounds in which a multivalent metal such as aluminum, iron, zinc, tin, titanium, antimony, magnesium and/or vanadium is coordinated with acetylacetone or ethyl acetoacetate, etc.

In an embodiment, the thermosetting crosslinking agent F may be in a range of about 0.01 to about 30 parts by weight based on 100 parts by weight of the binder resin. For example, the thermosetting crosslinking agent F may be in a range of about 0.1 to about 10 parts by weight based on 100 parts by weight of the binder resin. Cohesion of the adhesive layer may reduce and there may be a risk of cohesive failure during the high temperature process if the thermosetting crosslinking agent F is less than about 0.01 parts by weight based on 100 parts by weight of the binder resin, and the adhesive layer may not be able to secure sufficient adhesive strength before photocuring and there may be a risk of peeling or lifting if the thermosetting crosslinking agent F exceeds about 30 parts by weight based on 100 parts by weight of the binder resin.

Producing the binder resin having the siloxane-based functional group and the photoreactive functional group may be completed.

Physical Properties of the Binder Resin

In an embodiment, a weight average molecular weight of the acrylate-based resin having the siloxane-based functional group and the photoreactive functional group, such as the binder resin, may be in a range of about 50,000 g/mol to about 1,000,000 g/mol. For example, the weight average molecular weight of the acrylate-based resin having the siloxane-based functional group and the photoreactive functional group, such as the binder resin, may be in a range of about 100,000 to about 500,000 g/mol. Within the above weight average molecular weight range, the binder resin may have appropriate coating properties and cohesion, and residue may not remain on the adherend after the peeling step.

In an embodiment, the binder resin may have a glass transition temperature (Tg) in a range of about −80° C., to about −10° C. For example, the binder resin may have a glass transition temperature (Tg) in a range of about −40° C. to about −20° C. Within the above glass transition temperature range, the binder resin may have appropriate coating properties and cohesion, and residue may not remain on the adherend after the peeling step.

(ii) Photoinitiator G

In an embodiment, the photoinitiator G may be activated at a wavelength greater than or equal to about 250 nm, and may initiate photopolymerization by light transmitted through the base film 100 to easily reduce the adhesive strength of the adhesive layer. In combination with amine compound which is described later, the effect of lowering adhesion by photocuring may be further increased.

In an embodiment, the photoinitiator G may include, for example, thioxanthone, 2-chlorothioxanthone, 2-methylthioxanthone, 2,4-dimethylthioxanthone, isopropylthioxanthone, 2, 4-dichlorothioxanthone, 2,4-diethylthioxanthone, 2,4-diisopropylthioxanthone, dodecylthioxanthone, bis(2,4,6-trimethylbenzoyl)-phenylphosphine oxide, 2-methyl-1[4-(methylthio)phenyl]-2-morpholinopropan-1-one, mixture of oxy-phenyl-acetic acid 2-[2-oxo-2-phenyl-acetoxy-ethoxy]-ethyl ester and oxy-phenyl-acetic acid, 2-[2-hydroxy-ethoxy]-ethyl ester, 2-benzyl-2-dimethylamino-1-(4-morpholinophenyl)-butane-1-one and 2,4,6-trimethylbenzoyl-diphenyl-phosphine oxide may be included. More specifically, the photoinitiator G may include isopropylthioxanthone and bis(2,4,6-trimethylbenzoyl)-phenylphosphine oxide. These may be used alone or in combination of two or more.

(iii) Other Components

In addition to the above-described components, the adhesive composition may further include one or more additives selected from a group consisting of a tertiary amine compound, a tackifier resin, an initiator, a low molecular weight material, an epoxy resin, a curing agent, an ultraviolet stabilizer, an antioxidant, colorants, reinforcing agents, anti-foaming agents, surfactants, foaming agents, organic salts, thickeners, and flame retardants.

II. Method for Manufacturing a Semiconductor Device Using an Adhesive Sheet for Temporary Fixation Including an Adhesive Composition FIGS. 1 to 4 are cross-sectional views illustrating a method of manufacturing a semiconductor device using an adhesive sheet for temporary fixation including an adhesive composition according to an embodiment.

Referring to FIG. 1, an adhesive layer 200 including an adhesive composition may be formed on the base film 100 (e.g., formed directly thereon). The base film 100 and the adhesive layer 200 may together form an adhesive sheet 10 for temporary fixation.

The base film 100 may include a polymer material. In an embodiment, the polymer material may have a glass transition temperature (Tg) greater than or equal to about 60° C. The base film 100 may have sufficient heat resistance if the glass transition temperature of the base film 100 is greater than or equal to about 60° C. Accordingly, problems such as wrinkles and deformation may not occur due to the high temperature process, allowing the manufacturing of the semiconductor device to be easily performed. If the glass transition temperature of the base film 100 is less than about 60° C., defects may occur in the semiconductor device due to problems such as deterioration and deformation under high temperature conditions that occur during the manufacturing process of the semiconductor device. In an embodiment, the glass transition temperature of the polymer material included in the base film 100 may be in a range of about 70° C. to about 90° C. In this range, the above-described effect may be further increased.

In an embodiment, the polymer material may contain one or more polymer compounds selected from a group consisting of polyimide, polyamideimide, polyetheretherketone, polyethyleneterephthalate, polyethylenenaphthalate, polyphenylene sulfide and polyamide. For example, the polymer material may include polyimide, polyamide or polyamidoimide.

In an embodiment, when the base film 100 includes two or more types of polymer materials, the base film 100 may have a structure in which a plurality of films each including the polymer materials may be stacked in two or more layers or a single film including two or more types of the polymer materials may be stacked in a single layer.

The base film 100 may have, for example, a transmittance of greater than or equal to about 50% at a wavelength of greater than or equal to about 300 nm. Accordingly, the photoinitiator G in the adhesive layer 200, which will be described later, may easily initiate the photopolymerization reaction. If the base film 100 has a transmittance of less than about 50% at a wavelength that is greater than or equal to about 300 nm, light absorption of the photoinitiator G in the adhesive layer may not be sufficient, and thus adhesive strength may not be sufficiently reduced in a subsequent step of peeling the semiconductor chip 310.

In an embodiment, a thickness of the base film 100 may be in a range of about 5 μm to about 500 μm. For example, a thickness of the base film 100 may be in a range of about 10 μm to about 300 μm. In an embodiment, a thickness of the base film 100 may be in a range of about 25 μm to about 100 μm. In the above thickness ranges, the base film 100 may sufficiently support the wafer 300 including the plurality of semiconductor chips 310 and may not damage the semiconductor chips 310 in the subsequent step of peeling the semiconductor chips 310.

In an embodiment, the base film 100 may undergo additional processing to increase performance within a range that does not affect the effect desired by the present invention. For example, in an embodiment conventional physical or chemical treatments such as mat treatment, corona discharge treatment, primer treatment, or crosslinking treatment may be applied to the base film 100.

A method for forming the adhesive layer 200 on one side of the base film 100 may not be particularly limited. For example, in some embodiments the method of forming the adhesive layer 200 may include applying and drying the adhesive composition directly on the base film 100, or applying and drying the adhesive composition on a peelable substrate and then laminating the adhesive layer 200 on the base film 100.

The method of applying and drying the adhesive composition is not necessarily limited thereto. For example, in some embodiments the adhesive composition may be applied as is, or the adhesive composition may be diluted in a suitable organic solvent and applied by known means such as a comma coater, gravure coater, die coater, or reverse coater. The adhesive composition may be dried at a temperature in a range of about 60° C. to about 200° C. for about 10 seconds to about 30 minutes by a method of drying an organic solvent. An aging process may be additionally performed at about 40° C. to 7 about 0° C. for about 7 days to ensure sufficient crosslinking reaction of the adhesive composition.

In an embodiment, a thickness of the adhesive layer may be in a range of about 5 m to about 100 m. In the above thickness range, the adhesive layer may sufficiently support the wafer 300 including the plurality of semiconductor chips 310, and may not damage the semiconductor chips 310 in the subsequent step of peeling the semiconductor chips 310.

Figure 2:
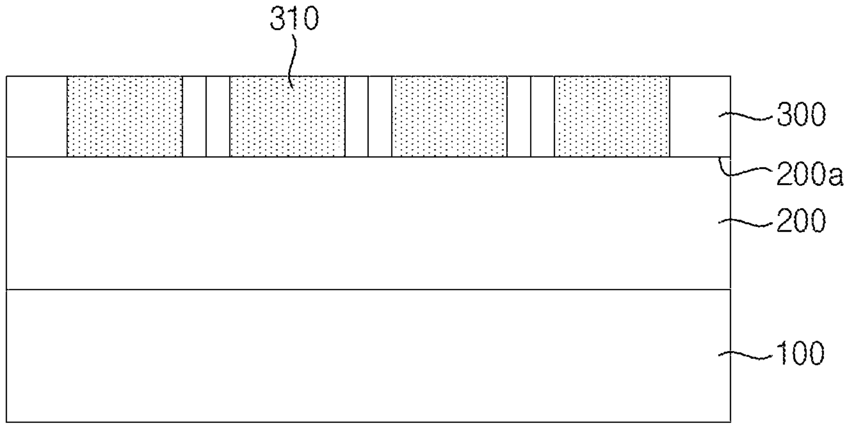

Referring to FIG. 2, the wafer 300 including the plurality of semiconductor chips 310 may be attached to a first surface 200*a* of the adhesive layer 200 that is not in direct contact with the base film 100. In an embodiment, a sawing process or a dicing process may be performed to divide the plurality of semiconductor chips 310 in the wafer 300 that is fixed on the adhesive sheet 10 into individual semiconductor chips 310.

Figure 3:
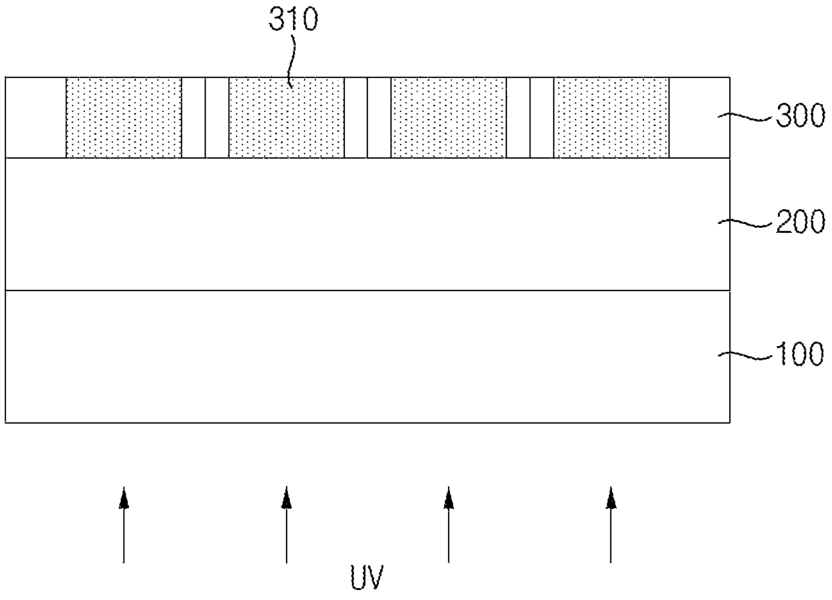

Referring to FIG. 3, ultraviolet rays may be irradiated through the base film 100 to the adhesive layer 200 including the adhesive composition. In an embodiment, the base film 100 may have a transmittance that is greater than or equal to, for example, about 50% at a wavelength greater than or equal to about 300 nm, and thus, the photoinitiator G in the adhesive layer 200 may easily initiate a photopolymerization reaction.

Accordingly, the adhesive composition may form photocrosslinking by photocuring, thereby increasing cohesion within the adhesive layer 200 and decreasing the adhesive strength of the adhesive composition.

Figure 4:
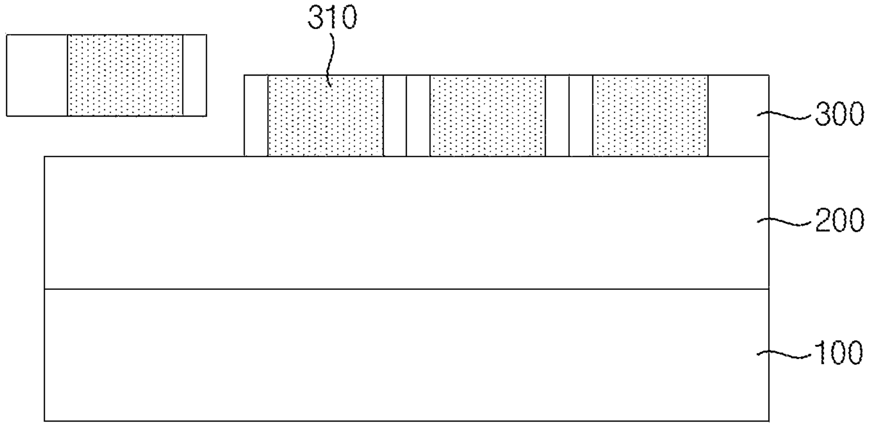

Referring to FIG. 4, the individual semiconductor chips 310 may be easily peeled from the adhesive layer 200 having a decreased adhesive strength.

Generally, in a method of manufacturing a semiconductor device, the adhesive layer 200 including the adhesive composition may be formed on a base film 100, the wafer 300 including the plurality of semiconductor chips 310 may be formed on the adhesive layer 200, and the sawing process may then be performed to separate the semiconductor chips 310 from each other. Thereafter, in the process of peeling the semiconductor chips 310 from the adhesive layer 200, ultraviolet rays may be irradiated to the adhesive layer 200 to reduce the adhesive force of the adhesive composition included in the adhesive layer 200.

To reduce the adhesive strength after ultraviolet irradiation, a release agent that may include, for example, an acrylate monomer having a siloxane-based functional group, may be added to the adhesive composition. During the heat curing process, such as the aging process, the release agent may be separated from other components to form a release layer. As a result, the adhesive strength of the adhesive layer 200 may be reduced even before irradiation with ultraviolet rays. In addition, monomer of the release agent may be transferred to the wafer 300.

However, in the method of manufacturing a semiconductor device using the adhesive composition according to an embodiment, the acrylate monomer having a siloxane-based functional group may be covalently bonded to a main chain of the binder resin, instead of being included in the adhesive composition as an additive. Accordingly, the acrylate monomer having a siloxane-based functional group may be less likely to form a release layer, thereby preventing the problem of low adhesion before ultraviolet curing. Additionally, the acrylate monomer having a siloxane-based functional group may be covalently bonded to the main chain of the binder resin to form the third repeating unit C. Thus, the possibility of the acrylate monomer that has a siloxane-based functional group being transferred to the base film 100 may be reduced.

While non-limiting embodiments of the present disclosure have been particularly shown and described, it will be understood by one of ordinary skill in the art that variations in form and detail may be made therein without departing from the spirit and scope of the present disclosure.

What is claimed is:

1. An adhesive composition comprising:

a binder resin and a photoinitiator;

wherein the binder resin includes a linear or a partially crosslinked copolymer having a plurality of repeating units derived from different acrylate monomers, wherein the copolymer includes a repeating unit having a photoreactive functional group at a side chain and a repeating unit having a siloxane-based functional group at a side chain, and wherein the repeating unit having a siloxane-based functional group is in a range of about 2% to about 5% of a total weight of the copolymer.

2. The adhesive composition of claim 1, wherein the copolymer includes:

a first repeating unit derived from a first acrylate monomer;

a second repeating unit derived from a second acrylate monomer having a reactive functional group, the second repeating unit forming a three-dimensional cross-linked structure or having the photoreactive functional group at the side chain; and a third repeating unit derived from a third acrylate monomer having the siloxane-based functional group and an acrylate functional group at an end.

3. The adhesive composition of claim 2, wherein:

the second repeating unit having the photoreactive functional group at the side chain is in a range of about 70 mol % to 90 mol % of the second repeating unit; and at least a portion of the second repeating unit excluding the second repeating unit having the photoreactive functional group forms the three-dimensional cross-linked structure.

4. The adhesive composition of claim 3, wherein the reactive functional group of the second repeating unit is a hydroxy group.

5. The adhesive composition of claim 3, wherein the three-dimensional cross-linked structure is derived from a thermosetting crosslinking agent reacting with the reactive functional group of the second repeating unit.

6. The adhesive composition of claim 3, wherein:

the photoreactive functional group is derived from a photocurable compound; and the photocurable compound includes the photoreactive functional group and a functional group performing an addition reaction with the reactive functional group of the second acrylate monomer that the second repeating unit is derived therefrom.

7. The adhesive composition of claim 6, wherein:

the functional group of the photocurable compound is an isocyanate group; and the photoreactive functional group of the photocurable compound is a functional group containing a carbon-carbon double bond.

8. The adhesive composition of claim 2, wherein a weight average molecular weight of the third acrylate monomer that the third repeating unit is derived therefrom is in a range of about 5000 g/mol to about 10000 g/mol.

9. The adhesive composition of claim 2, wherein the first repeating unit and the second repeating unit are in a range of about 90% to about 95% of a total weight of the binder resin.

10. The adhesive composition of claim 1, wherein the siloxane-based functional group is any one of the functional groups represented by the following Formula 1a, Formula 1b and Formula 1c,

[Formula 1a]

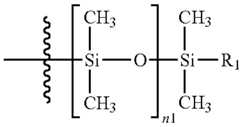

[Formula 1b]

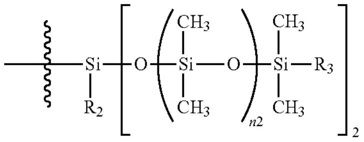

-continued

[Formula 1c]

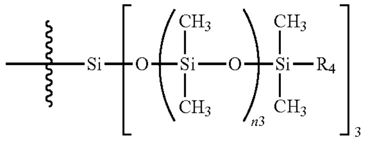

wherein, each of R1 to R4 is a hydrogen atom or an alkyl group having 1 to 10 carbon atoms, and each of n1 to n3 is an integer between 1 to 200.

11. An adhesive composition comprising:

a binder resin including a linear or partially crosslinked copolymer, the copolymer having a plurality of repeating units derived from different acrylate monomers and at least one repeating unit derived from an acrylic acid monomer, wherein the copolymer includes a repeating unit having a photoreactive functional group at a side chain and a repeating unit having a siloxane-based functional group at a side chain, and wherein the repeating unit having the siloxane-based functional group is in a range of about 2% to about 5% of a total weight of the copolymer.

12. The adhesive composition of claim 11, wherein the copolymer includes:

a first repeating unit derived from a first acrylate monomer;

a second repeating unit derived from a second acrylate monomer having a reactive functional group, the second repeating unit forming a three-dimensional cross-linked structure or having the photoreactive functional group at the side chain;

a third repeating unit derived from the acrylic acid monomer; and a fourth repeating unit derived from a third acrylate monomer having the siloxane-based functional group and an acrylate functional group at an end.

13. The adhesive composition of claim 12, wherein:

the second repeating unit having the photoreactive functional group at the side chain is in a range of about 70 mol % to about 90 mol % of the second repeating unit; and at least a portion of the second repeating unit excluding the second repeating unit having the photoreactive functional group forms the three-dimensional cross-linked structure.

14. The adhesive composition of claim 13, wherein the reactive functional group of the second repeating unit is a hydroxy group.

15. The adhesive composition of claim 13, wherein the three-dimensional cross-linked structure is derived from a thermosetting crosslinking agent reacting with the reactive functional group of the second repeating unit.

16. The adhesive composition of claim 13, wherein:

the photoreactive functional group is derived from a photocurable compound; and the photocurable compound includes an isocyanate group that reacts with the reactive functional group of the second repeating unit, and a photoreactive functional group including a carbon-carbon double bond.

17. The adhesive composition of claim 12, wherein a weight average molecular weight of the third acrylate monomer that the fourth repeating unit is derived therefrom is in a range of about 5000 g/mol to about 10000 g/mol.

18. The adhesive composition of claim 12, wherein the first repeating unit, the second repeating unit and the third repeating unit are in a range of about 90% to about 99% of a total weight of the binder resin.

19. The adhesive composition of claim 11, wherein the siloxane-based functional group is any one of the functional groups represented by the following Formula 1a, Formula 1b and Formula 1c,

[Formula 1a]

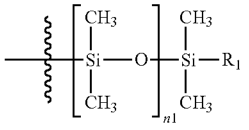

[Formula 1b]

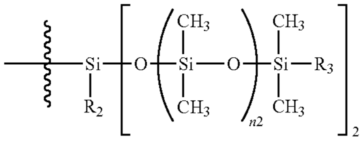

[Formula 1c]

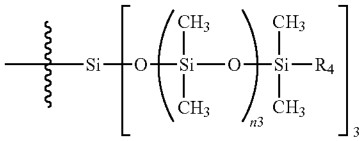

wherein in the above formula, each of R1 to R4 is a hydrogen atom or an alkyl group having 1 to 10 carbon atoms, and each of n1 to n3 is an integer between 1 to 200.

20. A method of manufacturing a semiconductor device comprising:

attaching a wafer including a plurality of semiconductor chips on an adhesive layer including a binder resin and a photoinitiator;

sawing the wafer to separate the semiconductor chips from each other; and peeling the semiconductor chips from the adhesive layer after irradiating the adhesive layer with ultraviolet ray, wherein the binder resin includes a linear or a partially crosslinked copolymer having a plurality of repeating units derived from different acrylate monomers, wherein the copolymer includes a repeating unit having a photoreactive functional group at a side chain and a repeating unit having a siloxane-based functional group at a side chain, and wherein the repeating unit having a siloxane-based functional group is in a range of about 2% to about 5% of a total weight of the copolymer.

* * * * *